United States Patent [19]

Hanak

[11] 4,292,092

[45] Sep. 29, 1981

[54] LASER PROCESSING TECHNIQUE FOR FABRICATING SERIES-CONNECTED AND TANDEM JUNCTION SERIES-CONNECTED SOLAR CELLS INTO A SOLAR BATTERY

[75] Inventor: Joseph J. Hanak, Lawrenceville, N.J.

[73] Assignee: RCA Corporation, New York, N.Y.

[21] Appl. No.: 156,081

[22] Filed: Jun. 2, 1980

[51] Int. Cl.³ .................... H01L 21/263; B23P 23/04; B23K 9/00

[52] U.S. Cl. .................... 148/1.5; 136/260; 148/187; 219/121 LH; 357/30; 357/91

[58] Field of Search ........................ 148/1–5, 148/187; 136/260, 249; 427/53.1; 219/121 LJ, 121 LH; 357/30, 91

[56] References Cited

U.S. PATENT DOCUMENTS

| | | | |
|---|---|---|---|
| Re. 27,772 | 10/1973 | Hanfmann | 219/121 LJ |
| 3,553,421 | 1/1971 | Schawlow | 219/121 |
| 4,044,222 | 8/1977 | Kestenbaum | 219/121 LM |
| 4,064,521 | 12/1977 | Carlson | 357/2 |
| 4,081,653 | 3/1978 | Koo et al. | 219/121LM |
| 4,125,757 | 11/1978 | Ross | 219/121 L |
| 4,167,015 | 9/1979 | Hanak | 357/16 |
| 4,181,538 | 1/1980 | Narayan et al. | 148/1.5 |
| 4,214,918 | 7/1980 | Gat et al. | 148/1.5 |
| 4,228,570 | 10/1980 | Chamberlin et al. | 29/33 R |
| 4,229,232 | 10/1980 | Kirkpatrick | 148/1.5 |

OTHER PUBLICATIONS

Bell;, A. E., RCA Review, 40 (1979) pp. 295–337.
Carlson et al., Quartely Rept.-3, San-2219-3, 1979, pp. 69–75.
Cook et al., Appl. Phys. Letts., 26 (1975) 124.

*Primary Examiner*—Upendra Roy
*Attorney, Agent, or Firm*—Birgit E. Morris; Donald S. Cohen; Sanford J. Asman

[57] ABSTRACT

A method of fabricating series-connected and tandem junction series-connected solar cells into a solar battery with laser scribing.

19 Claims, 9 Drawing Figures

LASER PROCESSING TECHNIQUE FOR FABRICATING SERIES-CONNECTED AND TANDEM JUNCTION SERIES-CONNECTED SOLAR CELLS INTO A SOLAR BATTERY

The U.S. Government has rights in this invention pursuant to Department of Energy Contract No. AC03-78ET21074.

This invention relates to solar cells. More specifically, this invention relates to a method of fabricating series-connected solar cells and series-connected tandem junction solar cells.

BACKGROUND OF THE INVENTION

Photovolotaic devices, i.e., solar cells, are capable of converting solar radiation into usable electrical energy. The energy conversion occurs as a result of what is well-known in the solar cell field as the photovolotaic effect. Solar radiation impinging on a solar cell and adsorbed by an active region of semiconductor material generates electrons and holes. The electrons and holes are separated by a built-in electric field, for example, a rectifying junction, in the solar cell. This separation of electrons and holes across the built-in electric field results in the generation of the photovoltage and photocurrent of the cell.

As the area of the solar cell increases, the series resistance of the solar radiation incident electrode of the solar cell also increases and requires larger and more complicated grid electrodes to withdraw the current generated during illumination of the solar cell with sunlight. Fabricating solar cells in long narrow strips and series-connecting the strips alleviates the need for complicated grid patterns. However, heretofore the fabrication of thin strips of series-connected solar cells or the series-connection of tandem junction solar cells required extensive photolithographic and chemical etching procedures. The photolithographic and chemical etching procedures often created pinholes in the semiconductor materials which resulted in the shorting out and degradation of portions of or the entire solar cell. In addition, photolithography is not readily adaptable to a large scale continuous processing and greatly increases the cost of fabrication of series-connected solar cells. Thus, it would be highly desirable to have a method of fabricating series-connected solar cells or series-connected tandem junction solar cells without numerous liquid processing steps.

SUMMARY OF THE INVENTION

A method of fabricating a series-connected and tandem junction series-connected solar battery using laser scribing is described. The method incorporates, inter alia, the laser scribing of a transparent conductive oxide (TCO) deposited on a transparent substrate into strips. Thereafter, the semiconductor material is deposited on the transparent substrate and strips of transparent conductive oxide. The transparent conductive oxide forms the top contact of the device. The device is then laser scribed again to divide the semiconductor material into strips without effecting the TCO. The strips are parallel with and adjacent to the previously formed laser scribing strips. Thereafter, a back metal contact is applied across the strips of transparent conductive oxide and semiconductor material and finally either laser scribed or sectioned parallel and adjacent to but disposed from the earlier two laser scribings so as to fabricate a device which is connected in series. Individual panels of series-connected solar cells and tandem junction solar cells can be connected in parallel so as to provide any desired voltage and current. The semiconductor materials, transparent conductive oxides, and back electrodes used in the fabrication of the solar battery should be selected so that either a single laser is required to scribe each successive layer with decreasing power or lasers of differing wavelength which can scribe one layer without affecting the other layers. Alternatively, for example, very short laser pulses of about 10 to about 20 nanoseconds and large pulse rates of about 0.2 to about 5 MHz can be used to scribe one layer without scribing other layers.

DETAILED DESCRIPTION OF THE INVENTION

Figure 1:
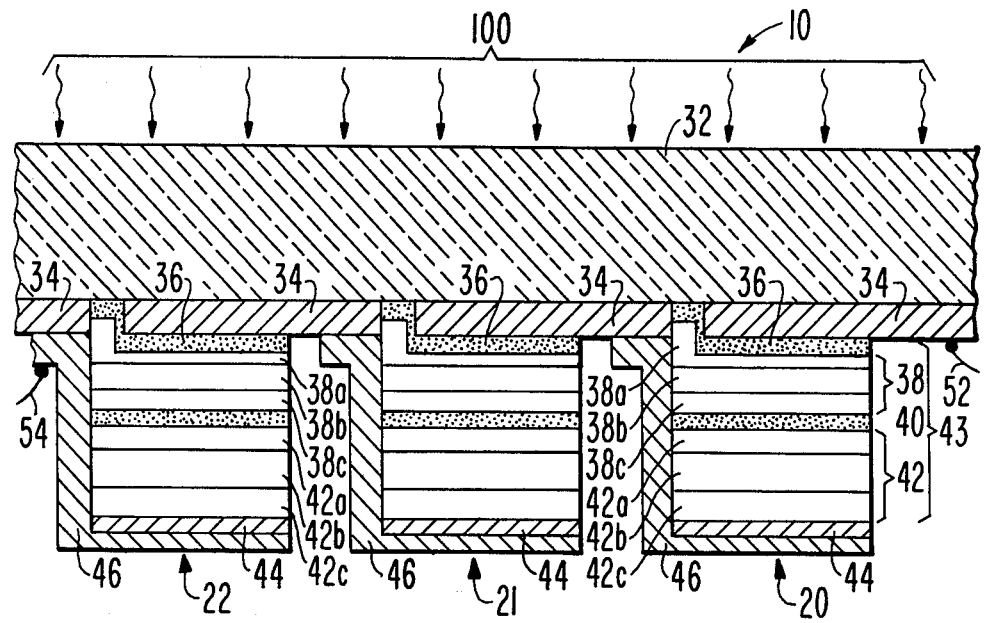
FIG. 1 illustrates a cross-section of a tandem junction hydrogenated amorphous silicon solar battery fabricated according to the invention from a plurality of tandem junction solar cells.

This invention will be more clearly illustrated by referring to FIG. 1 which illustrates a cross-section of a complete tandem junction solar battery fabricated from a plurality of interconnected tandem junction solar cells. The tandem junction solar battery 10 incorporates a series of tandem junction solar cells 20, 21, and 22 connected in series on a substrate 32. For example, the solar cells are fabricated with materials in accordance with U.S. Pat. No. 4,064,521 or U.S. applications, Ser. No. 070,513, filed Aug. 28, 1979, now abandoned and Ser. No. 109,637, filed Jan. 4, 1980, both of said applications and U.S. Patent incorporated by reference herein. Alternatively, the amorphous silicon can be fabricated with modifiers in addition to hydrogen and the silanes such as the halogens, evaporated and sputtered silicon or other semiconductor materials such as CdS, CdSe, CdTe, $Cu_2S$, and the like can be employed.

Each tandem junction solar cell 20, 21, and 22 comprises a strip of transparent conductive oxide 34 (TCO) as an incident electrode and two or more active layers 38 and 42 of semiconductor material separated by a tunnel junction 40. The active layers have regions 38a, 38b, and 38c and 42a, 42b, and 42c of differing conductivity type. The semiconductor layer or layers and tunnel junctions are collectively referred to as the active region 43. The active region 43 has a rectifying junction either within the region, i.e., a PN junction, or at a surface, i.e., a Schottky barrier. The active region 43 can be a layer of semiconductor material or a plurality of semiconductor layers as described above. The tandem junction solar cells are interconnected with a back electrode 44 and a series-connect 46.

Laser scribing is used to fabricate the transparent conductive oxide 34 and semiconductor layers 38 and 40 into strips. The strips of TCO are parallel and adjacent to the strips of semiconductor material. The laser scribing technique can also fabricate solar structures wherein there are strips of only one active region of semiconductor material 38 connected in series. The transparent incident electrode, semiconductor material, and back electrode material should be selected so that a laser of a single wavelength but of varying power, decreasing from the power needed to scribe the incident electrode, can scribe the devices. Alternatively, the materials can be selected so that a laser emitting light at one frequency can scribe one material, for example, amorphous silicon, but not another material such as the TCO.

Having described the finished solar cell structure 10, the fabrication procedure can be illustrated according to FIGS. 2a through 2f. The process will be illustrated by the description of the fabrication of a hydrogenated amorphous silicon solar battery.

Figure 2A:
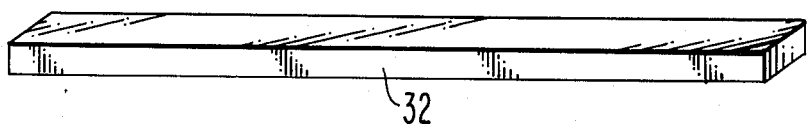
FIGS. 2a through 2f illustrate the process of fabricating a series of interconnected solar cells according to an embodiment of the invention.
Figure 2B:
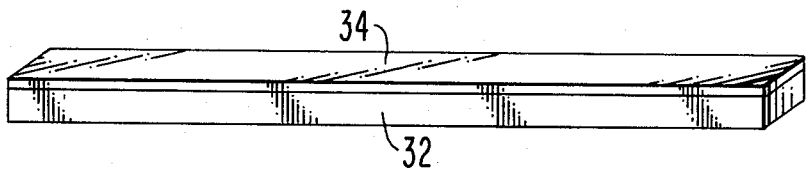

FIG. 2a illustrates a substrate 32 such as a glass, plastic, and the like. FIG. 2b illustrates the substrate 32 coated with a transparent conductive oxide 34 (TCO) as the incident electrode of a material such as indium tin oxide, tin oxide, and the like. The TCO is deposited by evaporation or sputtering or other methods known in the art. Alternatively, the glass substrate 32 coated with a transparent electrode material such as indium tin oxide is commercially available. The transparent conductive electrode material 34 should have a thickness of about 6.5 nanometers and a sheet resistivity of less than about 150 ohms per square, preferably less than about 100 ohms per square.

Figure 2C:
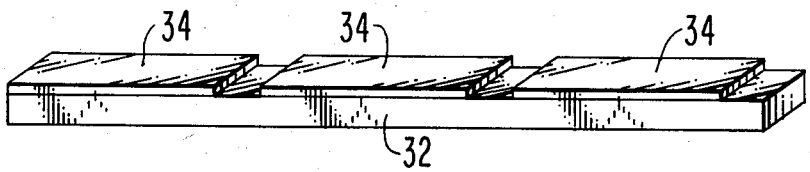

Referring to FIG. 2c, the substrate 32 containing the TCO layer 34 is laser scribed into strips. The laser can be any laser capable of scribing the TCO material. For example, a continuously excited (CW) neodynium YAG laser radiating at 1.06 micrometers operated in a Q-switched mode at an average power of about 4.5 watts with a pulse rate of about 36 kilohertz and a scribing rate of about 20 centimeters per second can be used.

Figure 2D:
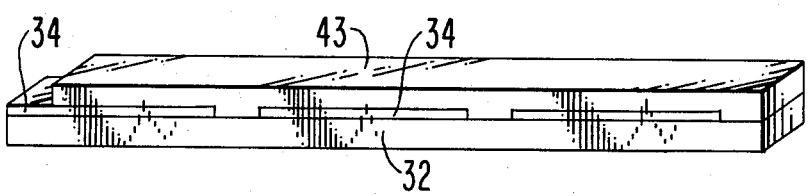
Figure 2E:
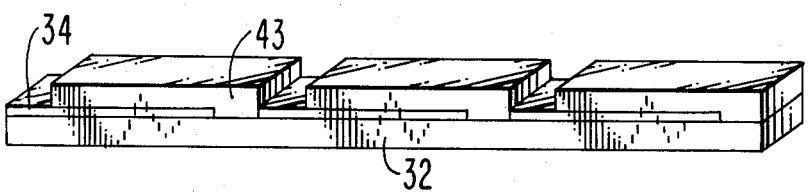

Thereafter, as illustrated in FIG. 2d, the active region 43 is deposited on the incident electrode strips. The substrate 32 incorporating the TCO layer 34 and the active semiconductor region 43 is laser scribed again, parallel and adjacent to the previous scribing down to the transparent electrode as illustrated in FIG. 2e. For example, a 1.06 micrometer CW neodynium YAG laser operating at a pulse rate of 36 kilohertz, a scribing rate of 20 centimeters per second and adjusted power of 1.7 watts is sufficient to scribe hydrogenated amorphous silicon, and a cermet down to the TCO strips 34 but not through them.

Figure 2F:
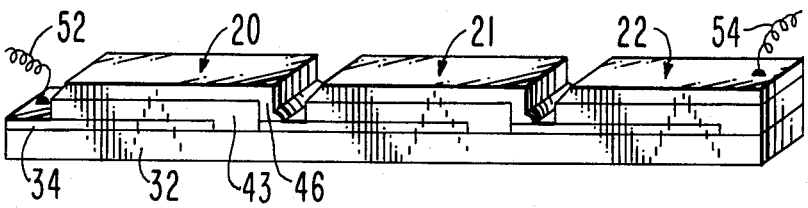

As illustrated in FIG. 2f, a back electrode material of titanium, aluminium, indium or like material is angle evaporated onto the solar cell strips for example at an angle of from about 30° to about 45° with respect to a perpendicular drawn from the substrate 32 such that the material forms strips 46 which interconnect the individual cells in series. Finally, contacts 50 and 52 are connected to the solar battery structure by methods known in the art.

Figure 3A:
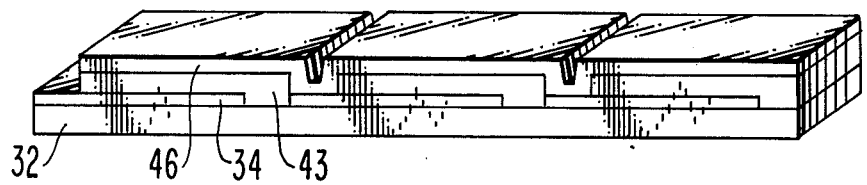
FIGS. 3a and 3b illustrate an alternative embodiment of the invention for interconnecting solar cells after the steps illustrated in FIGS. 2a and 2e.
Figure 3B:
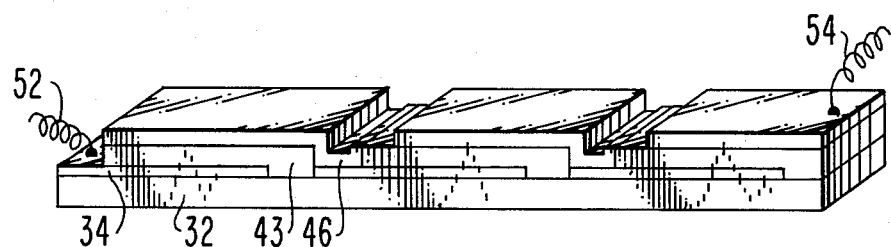

Alternatively, the back electrode material can be evaporated, sputtered, or deposited by other means known in the art completely across the back of the strips of semiconductor material as illustrated in FIG. 3a and thereafter laser scribed parallel to the laser scribing which formed the groove illustrated in FIG. 2e. The groove is adjacent to the groove in FIG. 2e as illustrated in FIG. 3b. A CW neodynium YAG laser scribing with a similar pulse rate and speed but with a power of about 1.3 watts is sufficient to scribe the back electrical contact forming a groove in same, but not scribe the semiconductor or TCO layers. This fabrication technique is applicable to semiconductor materials where the lateral sheet resistivity is sufficiently high, e.g. >10 ohms per square, such that the back electrical contact contacting two walls of adjacent semiconductor strips does not short out the cells, for example, hydrogenated amorphous silicon, cermets and the like. If the semiconductor or other materials are used in forming the active region have a low lateral sheet resistivity then the edge of the active region must be shielded with a suitable dielectric before the strips are connected in series.

The invention will be further illustrated by the following examples but it is to be understood that the invention is not to be limited solely to the details described therein. Modifications which would be obvious to one of ordinary skill in the solar cell art are contemplated to be within the scope of the invention.

EXAMPLE I

A 3" by 3" (7.6 cm by 7 cm) glass substrate coated with indium tin oxide having a thickness of about 250 nanometers and a resistivity of about 10 ohms per square, manufactured by Triplex Glass Company, Ltd., Kings Norten, Burmingham, England was laser scribed with a Q-switched neodynium YAG CW laser at a power of 4.5 watts with a pulse rate of 36 kilohertz, a scribing rate of 20 centimeters per second, and a lens focal length of about 27 millimeters. The laser scribing formed a groove with a width of about 0.002 centimeter between strips of indium tin oxide about 0.5 cm wide. The underlying glass slightly melted in spots to a depth of a few hundred angstroms. After the laser scribing, the conductivity across the scribed area was measured and found to be slightly conductive. The slightly conducting area was removed by immersing the substrate in a solution of one part concentrated hydrochloric acid in two parts water for about 45 seconds.

Thereafter, the active semiconductor region comprising $PtSiO_2$ cermet about 15 nanometers thick containing about 12 volume percent of platinum, a $P^+$ doped layer of hydrogenated amorphous silicon about 36 nanometers thick, an undoped layer of hydrogenated amorphous silicon about 590 nanometers thick, and a final layer of $N^{30}$ doped hydrogenated amorphous silicon 36 nanometers thick was deposited on the substrate and the strips of indium tin oxide by methods taught in U.S. Pat. No. 4,167,051, incorporated herein by reference. The amorphous silicon was deposited by a glow discharge in an atmosphere containing silicon, hydrogen, and suitable conductivity modifiers. The cermet was formed by cosputtering of Pt and $SiO_2$.

The active semiconductor region was scribed by the previously mentioned laser to form grooves in the active semiconductor region parallel but displaced from the initial laser scribing. The laser was operated at a power of 1.7 watts and a focal length of 48 millimeters with a similar pulse rate and scribing rate as recited previously. The width of the scribed groove was about 0.003 centimeter. The scribing depth was down to the ITO but not through it.

Thereafter, the strips and active region and transparent substrate were coated with a back electrode of titanium to a thickness of about 100 nanometers. The cell was scribed for a third time forming a groove in the back electrical contact parallel and adjacent to previous scribings, with the laser operated at a power of about 1.3 watts, a focal length of 75 millimeters and previously recited pulse rates and scribing speeds. Copper strips were attached to the ends of the electrodes by means of silver epoxy cement. Finally the electrical shorts and shunts were removed by the application of a 5 volt reverse bias to each cell.

The cell fabricated according to the procedure was tested with a light having an intensity equivalent to AM1 sunlight. A solar battery consisting of 12 individual solar cell strips had a $V_{oc}$ of 9.3 volts, about 0.775 volt per cell, a short circuit current $J_{sc}$ of about 5.3 milliamps per centimeter square, a fill factor FF of about 0.51, and an efficiency of about 2.1 percent.

EXAMPLE II

A series-connected solar battery was fabricated in accordance with the procedures outlined in Example I, however, the back contact metal was indium and it was evaporated onto the active region of the semiconductor device along with the indium tin oxide. Thereafter, grooves were laser scribed in the indium using a laser power of 1.3 watts parallel and adjacent to the grooves laser scribed in the hydrogenated amorphous silicon material. After attaching electrodes and removing the electrical shorts, the solar cells comprising 10 individual strip cells connected in series exhibited an open circuit voltage of 7.9 volts, a short circuit current of 4.6 milliamps per centimeter squared, a fill factor of 0.51, and an efficiency of 1.9 percent when exposed to a test light having an intensity of about AM1 sun.

EXAMPLE III

A 7.6 cm×7.6 cm glass substrate coated with indium tin oxide having a resistivity of about 10 ohms by square was laser scribed in accordance with the procedure outlined in Example I.

Thereafter, a tandem junction structure, comprising a platinum cermet, a layer of amorphous silicon, a tunnel junction, and a second layer of amorphous silicon, was deposited on the substrate and the strips of indium tin oxide. The cermet was about 7.5 nanometer thick. The first layer of amorphous silicon, having a P-type region was about 30 nanometers thick, an intrinsic region about 76 nanometers thick, and an N-type region about 38 nanometers thick, was deposited on the platinum cermet. A tunnel junction of a platinum cermet about 7.5 nanometers thick was deposited on the amorphous silicon layer. The second layer of amorphous silicon, having a P-type region, and an intrinsic region, and an N-type region with thicknesses of 30 nanometers, 408 nanometers, and 45 nanometers, respectively, was deposited on the tunnel junction. The amorphous silicon regions were deposited by the glow discharge and the platinum cermets were deposited by the cosputtering platinum and $SiO_2$. These layers were scribed to form a groove parallel and adjacent to the previous scribing with a laser operating under the conditions outlined in Example I at a power of 1.7 watts. The scribed grooves were adjacent to and parallel with the ITO grooves as depicted in FIG. 2e. Thereafter, a 100 nanometer thick layer of tin was evaporated in angle of about 30° with respect to the perpendicular from the substrate, as illustrated in FIG. 2f. Copper strips were attached to the electrode by means of silver epoxy. The shorts were removed by the application of a reverse bias voltage.

The solar battery consisted of 10 cells in series horizontally with two in tandem vertically for a total of 20 cells. The device had an open circuit voltage of 11.8 volts when exposed to light having an intensity of about AM1.

I claim:
1. A method of fabricating a solar battery comprising:
   scribing a transparent electrode on a transparent substrate with a laser of sufficient power to form a plurality of transparent electrode strips;
   fabricating an active region of a semiconductor material on said substrate and said transparent electrode strips;
   scribing said active region with a laser parallel and adjacent to the first scribing so as to scribe through said active region and form strips of active region but not the transparent electrode; and
   interconnecting said strips of active region in series with a back electrode.

2. The method according to claim 1 wherein said transparent electrode, said active region, and said back electrode are selected such that the laser requires a greater power to scribe said transparent electrode than said active region and a greater power to scribe said active region than said back electrode.

3. The method according to claim 2 wherein said active region is a semiconductor material selected from the group consisting of hydrogenated amorphous silicon, evaporated silicon, sputtered silicon, CdS, CdSe, CdTe, and $Cu_2S$.

4. The method according to claim 3 wherein the active region is a plurality of layers of semiconductor material.

5. The method according to claim 3 wherein the active region is hydrogenated amorphous silicon.

6. The method according to claim 5 wherein the laser is a continuously excited neodynium YAG laser emitting light of a wavelength of about 1.06 micrometers.

7. The method according to claim 6 wherein said laser is operated in a Q-switched mode at a repetition rate of about 36 kilohertz.

8. The method according to claim 7 wherein the scribing is performed by said laser operating at a power of about 4.5 watts to scribe said transparent electrode material, and about 1.7 watts to scribe said active region.

9. The method according to claim 8 wherein said active region comprises a plurality of layers of hydrogenated amorphous silicon.

10. The method according to claim 9 wherein each pair of adjacent layers of hydrogenated amorphous silicon are separated by a tunnel junction.

11. The method according to claim 10 wherein said tunnel junction is a cermet.

12. The method according to claim 11 wherein said back electrode is fabricated by angle evaporation.

13. The method according to claim 1 further comprising the fabrication of the back electrode across the strips of active region and the transparent electrode followed by the laser scribing of said back electrode parallel and adjacent to the scribing of said strips of active region.

14. The method according to claim 13 wherein a laser can scribe said back electrode with a lower power than is required to scribe said active region and said active region requires a lower power for scribing than said transparent electrode.

15. The method according to claim 14 wherein the active region is hydrogenated amorphous silicon.

16. The method according to claim 15 wherein the laser is a continuously excited neodynium YAG laser emitting light of a wavelength of about 1.06 micrometers.

17. The method according to claim 16 wherein said laser is operated in a Q-switched mode.

18. The method according to claim 17 wherein said active region is a plurality of layers of hydrogenated amorphous silicon.

19. The method according to claim 18 wherein each pair of adjacent layers of hydrogenated amorphous silicon are separated by a tunnel junction.

* * * * *

UNITED STATES PATENT AND TRADEMARK OFFICE
CERTIFICATE OF CORRECTION

PATENT NO. : 4,292,092

DATED : September 29, 1981

INVENTOR(S) : Joseph John Hanak

It is certified that error appears in the above-identified patent and that said Letters Patent is hereby corrected as shown below:

Column 4, line 3 : ">10" should be --$>10^{10}$--;

line 20: "7 cm" should be --7.6 cm--;

line 44: "$N^{30}$" should be --$N^+$--;

Column 5, line 39: "nanometer" should be --nanometers--.

Signed and Sealed this

Ninth Day of March 1982

[SEAL]

Attest:

GERALD J. MOSSINGHOFF

Attesting Officer

Commissioner of Patents and Trademarks